United States Patent [19]

Fulton et al.

[11] 4,373,138
[45] Feb. 8, 1983

[54] HYBRID UNLATCHING FLIP-FLOP LOGIC ELEMENT

[75] Inventors: Theodore A. Fulton, Warren Township, Somerset County; Arthur F. Hebard, Bernardsville, both of N.J.

[73] Assignee: Bell Telephone Laboratories, Incorporated, Murray Hill, N.J.

[21] Appl. No.: 232,011

[22] Filed: Feb. 6, 1981

Related U.S. Application Data

[63] Continuation of Ser. No. 974,376, Dec. 29, 1978, abandoned.

[51] Int. Cl.³ .............................................. H03K 3/38
[52] U.S. Cl. .................................. 307/277; 307/306; 307/476; 365/162
[58] Field of Search ............... 307/277, 462, 476, 306; 365/162; 357/5

[56] References Cited

U.S. PATENT DOCUMENTS 3,943,383  3/1976  Hamel .................................. 307/261
3,953,749  4/1976  Baechtold et al. .................. 307/277
4,051,393  9/1977  Fulton ................................. 307/306

OTHER PUBLICATIONS

Baechtold et al., Two-Junction Josephson Tunneling Device Flip-Flop Shift Register, IBM Technical Disclosure Bulletin, vol. 17, No. 10, pp. 3087-3088, Mar. 1975.

Hamel, Josephson Device Level Converter, IBM Technical Disclosure Bulletin, vol. 15, No. 11, pp. 3561-3562, Apr. 1973.

*Primary Examiner*—John Zazworsky
*Attorney, Agent, or Firm*—Michael J. Urbano

[57] ABSTRACT

Described is a DC powered flip-flop logic or memory element (i.e., circuit) which comprises two Josephson junction gates $J_1$ and $J_2$ which operate individually in the latching mode. In one logic state, the gate $J_1$ is at $V_1=O$ while $J_2$ is at $V_2 \neq O$. In the other logic state, the roles of the two junctions are reversed. The two junctions are interconnected by a passive network such that the switching of $J_2$, say, from $V_2=O$ to $V_2 \neq O$ induces a current-voltage transient on $J_1$ which returns it to $V_1=O$, and conversely.

17 Claims, 7 Drawing Figures

HYBRID UNLATCHING FLIP-FLOP LOGIC ELEMENT

This is a continuation, of application Ser. No. 974,376 filed Dec. 29, 1978, now abandoned.

BACKGROUND OF THE INVENTION

This invention relates to superconductive logic and memory circuits employing Josephson junction devices.

Josephson tunnel junctions appear to have a promising future in logic and switching applications. Most recent work has concentrated on hysteretic tunnel junctions used in a current-steering mode; i.e., a junction carrying a zero-voltage (V=0) current, I, derived from an external bias, is switched to $V \neq 0$ by application of a control current. As a result, the bias current is diverted into a parallel path where it serves as a control current for one or more downstream junctions.

While switching from V=0 to $V \neq 0$ is a well-understood process, the necessary complementary transition from $V \neq 0$ to V=0 is less straightforward to implement. It generally requires the reduction of the junction current I below the "drop-back" current $I_o$ and/or the reduction of the junction voltage V below the corresponding voltage $V_o$. Considerable work has been published on the AC powered latching mode of operation in which the junctions are reset to V=0 by momentarily decreasing the bias current from an external source to a sufficiently low value. In principle, however, DC powered circuitry seems less complicated. Several DC powered schemes, including a two-gate memory loop, have been described. In this configuration, the switching of one of the gates diverts its bias current into a parallel, zero-resistance path containing the second gate. Switching of the second gate then returns the bias current to the first gate in a symmetric manner.

SUMMARY OF THE INVENTION

Our invention is a DC powered flip-flop logic or memory element (i.e., circuit) which comprises two Josephson junction gates $J_1$ and $J_2$ which operate individually in the latching mode. The gates may take on a variety of designs: single junctions, interferometers, or goalposts, for example. In one logic state, the gate $J_1$ is at $V_1=0$ while $J_2$ is at $V_2 \neq 0$. In the other logic state, the roles of the two gates are reversed. The two gates are interconnected by a passive network such that the switching of $J_2$, say, from $V_2=0$ to $V_2 \neq 0$ induces a current-voltage transient on $J_1$ which returns it to $V_1=0$, and conversely. We have adopted the acronym HUFFLE, hybrid unlatching flip-flop logic element, to identify the circuit.

In one illustrative embodiment, a HUFFLE comprises a pair of coupled loop circuits each of which includes a Josephson junction gate $J_1$ ($J_2$), a resistor $R_1$ ($R_2$), the self-inductance $L_1$ ($L_2$) of the gate branch, and a common branch $L_3$, with ($L_1 + L_2$) being small compared to $L_3$. The current in the common branch may serve as an output to control other circuits. Bias current $I_b$ enters one loop circuit and leaves the other, and separate control currents $I_{c1}$ and $I_{c2}$ control the state of $J_1$ and $J_2$, respectively. The circuit resistances $R_1$ and $R_2$ and junction critical currents $I_{J1}$ and $I_{J2}$ are chosen so that $I_{Ji}R_i \sim \Delta_i$ (where i=1, 2, and $2\Delta$ is the superconductor energy gap voltage), a regime of operation which provides latching operation for the junctions, i.e., the load line of slope $R_i$ intersects the I-V curve above the drop-back voltage $V_o$. For example, $\Delta_i/3 < I_{Ji}R_i < 3\Delta_i/2$ is suitable if $V_o < \Delta_i/3$.

In one logic state, $V_1 \neq 0$, $V_2 = 0$, and bias current flows from $I_b$ into one loop through $R_1$, through $L_3$ in one direction, through $J_2$ and out of the other loop back to $I_b$. To switch logic states, a control current $I_{c2}$ causes $J_2$ to switch from $V_2=0$ to $V_2 \neq 0$. For periods of time short compared to $L_3/R_1$, the current in $L_3$ can be viewed as constant. But, on a much shorter time scale, the current distribution in the branches formed by $J_1$, $L_1$, $L_2$, and $J_2$ is changed to adapt to the voltage across $J_2$.

The new distribution consists of a circulating current which is superimposed on the currents existing in the original logic state. In particular, the circulating current induced in $J_1$ by switching $J_2$ to $V_2 \neq 0$ is opposite to the current flowing therein in the original state. This opposing current transient should at least reduce the current in $J_1$ to below its drop-back current $I_o$. Where $I_o$ is ill-defined, as for some complex gate designs, it may be desirable for the opposing current to reverse the sign of the original current in $J_1$. Thus, $J_1$ returns to $V_1=0$, provided that the current transient lasts long enough to discharge the capacitance of $J_1$. Although we have referred to current transients here, it is apparent that a gate which switches states to $V \neq 0$ can be viewed as either a current or a voltage source depending on what part of its I-V curve it is operating. Thus, for some gate designs it may be more appropriate to describe its operation in terms of voltage transients.

After this transient phenomenon, which latches $J_1$ at $V_1=0$, the bias current diverts from $R_1$ into the low-resistance path; that is, it flows into the one loop through $J_1$, through $L_3$ in the opposite direction, through $R_2$ and out of the other loop. Subsequent switching of states involves the symmetric process starting with control current $I_{c1}$ applied to $J_1$ to switch it to $V_1 \neq 0$.

This circuit is reasonably fast (sub-hundred picosecond speed) and an uncomplicated design with acceptably wide margin of operation.

BRIEF DESCRIPTION OF THE DRAWING

Our invention, together with its various features and advantages, can be readily understood from the following more detailed description taken in conjunction with the accompanying drawing, in which.

DETAILED DESCRIPTION

General Considerations

Figure 1:
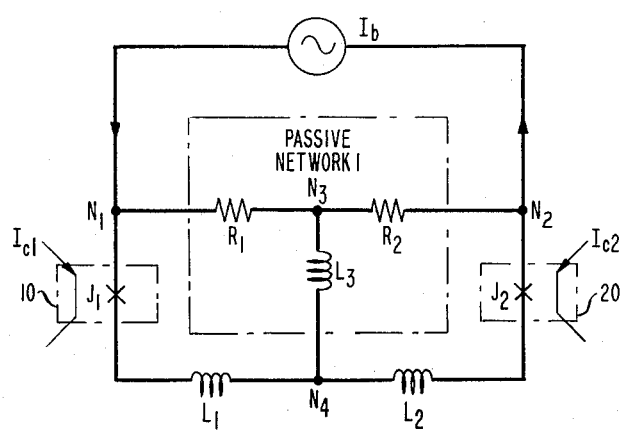
FIG. 1 is a circuit schematic of one embodiment of our invention in which the passive coupling network includes a T-network with $R_1$ and $R_2$ in the horizontal branches and $L_3$ in the vertical branch.

Before discussing our invention in detail, several matters should be understood. First of all, each of the circuits to be described is in practice maintained within a cryogenically cooled environment well known in the art in order to reduce the temperature below the superconducting transition temperature of the superconductors used to form the circuits. Secondly, each of the circuits is in practice typically fabricated on, but insulated from, a superconducting ground plane. The thickness of the insulator between the ground plane and the circuit elements can be used, in conjunction with the thickness and length of the elements, to control the inductances of the circuit branches. Alternatively, the ground plane may be patterned with apertures to control the inductances. Third, in the drawing discrete inductors are depicted for the purpose of explanation only. These inductors actually represent the distributed self-inductance or mutual inductance of the superconductive conductors or strip lines. All such conductors have some inductance, but inductors are shown only where helpful to the discussion. No lumped-circuit inductors are actually utilized. The conductors, of course, also possess distributed capacitance and hence may be viewed as transmission lines. In cases where the transmission line characteristic impedance is large compared to circuit resistance, only the inductances of the conductors need be considered in describing circuit operation. Fourth, the drawing also depicts discrete resistors which are formed by inserting segments of normal metals or nonsuperconductors in the otherwise superconducting circuit paths.

Basic HUFFLE

With reference now to FIG. 1, there is shown a HUFFLE comprising first and second Josephson junction gates $J_1$ and $J_2$ which operate individually in the latching mode but which are interconnected by a passive network 1 that yields an unlatching mode of operation of the overall circuit. DC bias current $I_b$ is applied to one gate $J_1$ and extracted from the other gate $J_2$ with $I_b$ chosen to be less than the critical currents $I_{J1}$ and $I_{J2}$ of $J_1$ and $J_2$, respectively. The gates which may be single Josephson tunnel junctions or may be multiple junctions interconnected in various circuit configurations such as interferometers, goalposts or JAWS (Josephson-attoweber switch). The latter two circuits are described by T. A. Fulton in U.S. Pat. No. 4,051,393 issued on Sept. 27, 1977, and in an application Ser. No. 34,589 filed on Apr. 30, 1979, respectively. Thus, the state of the gates is controlled by pulsed or DC control currents $I_{c1}$ and $I_{c2}$ which either generate a magnetic field to depress $I_J$ below $I_b$ (as in an interferometer) or add current to a gate to exceed $I_J$ (as in a goalpost or JAWS).

In one binary logic state, $J_1$ is at $V_1=0$ while $J_2$ is at $V_2\neq 0$ whereas in the other logic state the roles of the two junctions are reversed. The passive network 1 is designed so that, when $I_{c2}$ switches $J_2$ from $V_2=0$ to $V_2\neq 0$, a negative current-voltage transient induced on $J_1$ switches $J_1$ to $V_1=0$. Conversely, when $I_{c1}$ switches $J_1$ from $V_1=0$ to $V_1\neq 0$, a negative current-voltage transient induced on $J_2$ switches $J_2$ to $V_2=0$. The transients should be of sufficient magnitude to reduce the current (or voltage) in the gate being switched to $V=0$ to below its switch-back or drop-back current $I_o$ (or voltage $V_o$). In addition, the duration of the transient should be long enough to discharge the capacitance of the gate being switched to $V=0$. As mentioned previously, where $I_o$ and $V_o$ are ill-defined, it may be desirable for the transient to actually reverse the sign of the current (or voltage) on the gate being switched to $V=0$. In any event, the overall circuit operates in a nonlatching mode even though the individual gates function in a latching mode.

The manner in which the passive network effects this unlatching mode of operation can be best understood with reference to an illustrative embodiment (FIG. 1) in which the passive network 1 comprises a T-circuit in which resistors $R_1$ and $R_2$ are located in the horizontal branches and inductance $L_3$ is in the vertical branch. The interconnection of the gates and the T-circuit is such that two coupled loop circuits are formed: one loop circuit includes $J_1$, $L_1$ (the self-inductance of the branch including $J_1$), $L_3$ and $R_1$ and the other loop circuit includes $J_2$, $L_2$ (the self-inductance of the branch including $J_2$), $L_3$ and $R_2$. The DC bias current $I_b$ is applied to node $N_1$ between $J_1$ and $R_1$ and is extracted from node $N_2$ between $J_2$ and $R_2$. The inductances $L_1$ and $L_2$ should be small compared with $L_3$; typically, $(L_1+L_2)/L_3 < 1/5$. $R_1$ and $R_2$ may take a variety of values, but in a preferred embodiment, $R_1 \approx R_2$.

In operation, the HUFFLE is initially set up as follows:

(a) At first, both gates are in the $V=0$ state because $I_b < I_J$.

(b) Control means 10 (e.g., current $I_{c1}$) applied to $J_1$, for example, causes it to switch to the $V_1 \neq 0$ state. Control means 10 may include a strip line which overlays $J_1$ so that the magnetic field generated by $I_{c1}$ depresses the critical current of $J_1$, or it may include a suitable circuit connection which adds a fraction of $I_{c1}$ to the bias current in $J_1$ so as to exceed its critical current. Similar comments apply to $I_{c2}$.

(c) The bias current from current source $I_b$ is diverted from $J_1$. In effect, $J_1$ becomes a higher resistance than $R_1$. At first, the current flows through resistances $R_1$ and $R_2$ [after a time determined by the time constants $(L_1+L_2)/(R_1+R_2)$ and $(R_1+R_2)$ $C_1$] because $L_3$ is relatively large and current is relatively slow to divert through it. At this stage, the current flows primarily from $I_b$ into $N_1$ through $R_1$ and $R_2$ and out of $N_2$ back to $I_b$.

(d) Eventually (over times on the order of $L_3/R_2$) the current will prefer to flow through $L_3$ and $J_2$ (a low resistance path since $V_2=0$) rather than through $R_2$. That is, the current path is from $I_b$ into $N_1$, across through $R_1$ to $N_3$, down through $L_3$ to $N_4$ and up through $L_2$, $J_2$, and $N_2$ back to $I_b$. This ends the set-up routine. The current path at this stage represents the logic "1" state, for example. It is characterized by one junction, $J_1$, being at $V_1\neq 0$ and the other, $J_2$, at $V=0$, and the bias current $I_b$ flowing through $L_3$ in a particular direction; i.e., out of $N_3$ and into $N_4$. An important point here is that the resistor $R_1$ should be such that the voltage across $J_1$ is below $2\Delta_1$, the gap voltage of $J_1$, but above the drop-back voltage of $J_1$. It is convenient to simulate the I-V curve of $J_1$ (and also $J_2$) for the range $V_1 < 2\Delta_1$ by resistances $R_{J1}$ (and $R_{J2}$) where $R_{J1} >> R_1$ (and $R_{J2} >> R_2$), typically by a factor of 5 or more. Then, the division of bias current $I_b$ in the logic "1" state through $R_1$ and $J_1$ is in inverse proportion to $R_1$ and $R_{J1}$; i.e., mostly through $R_1$ (and hence $L_3$).

(e) The next operation is to switch from the logic "1" state to the logic "0" state by applying control means 20 (e.g., current $I_{c2}$) to $J_2$ which causes $J_2$ to switch from $V_2=0$ to $V_2\neq 0$.

(f) Now is the crucial time for resetting. For periods of time short compared to $L_3/R_1$ one can view the current in $L_3$ as being essentially fixed there, since the change of current $\Delta I$ in $L_3$ would require time $\Delta t \approx \Delta I L_3/2\Delta_2$, where $2\Delta_2$ is the gap voltage of $J_2$. On a much shorter time scale determined by the largest of the time constants $(L_1+L_2)/(R_1+R_2)$, $(R_1+R_2)C_1$ and $(2\Delta_2/I_b)C_2$, however, the current distribution in the outside loop (that formed by the branches containing $J_1$, $L_1$, $L_2$, $J_2$, $R_2$, and $R_1$) is changed to adapt to the voltage across $J_2$. The new distribution consists of a circulating current of approximate magnitude $2\Delta_2/(R_{J1}+R_1+R_2)$ which is superimposed upon the previous division of currents existing in logic state "1". Of particular interest is the current through $J_1$. At the end of logic state "1", this current is $I_b[R_1/(R_1+R_{J1})]$ and flows out of $N_1$ through $J_1$ and into $N_4$. The circulating current induced by the voltage across $J_2$ is of the opposite sense, i.e., it flows out of $N_4$ into $N_1$. Thus, if $$\frac{2\Delta_2}{(R_{J1}+R_1+R_2)} > \frac{I_b R_1}{(R_{J1}+R_1)},$$

then the current through $J_1$ actually reverses its sign and $J_1$ will return to $V_1=0$. For $I_b R_1 < 2\Delta_2$ and $R_{J1} >> R_1 \approx R_2$, the inequality is easily satisfied. Typical values might be $I_b=1$ mA, $2\Delta=2.5$ mV, $R_{J1}\approx 10$ $\Omega$, $R_1=R_2=1\Omega$.

Another way of looking at the same current reversal is that on a time scale short comparted to $L_3/R$ the voltages across $J_2$, which is negative compared to that initially across $J_1$, will also appear across resistors $R_1$, $R_2$, and $R_{J1}$ in series and be superimposed on the previous voltage. $R_{J1}$ drops most of this voltage (i.e., nearly $-2\Delta_2$) and, if the initial voltage across $J_1$ was well below $+2\Delta_2$, then the ultimate voltage across $J_1$ would be negative, meaning a reversal in sign of the current.

(g) With $J_1$ now latched at $V_1=0$ there is a further transfer of current into the outside loop from $J_2$.

(h) Finally, over a time constant of about $L_3/R_1$ the bias current diverts from $R_1$ and flows into the low-resistance path from $I_b$ to $N_1$, through $J_1$, through $L_3$ in the opposite direction compared to the logic "1" state (i.e., from $N_4$ into $N_3$), through $R_2$ to $N_2$ and back to $I_b$. This state represents logic "0" and is the mirror image of the logic "1" state. Subsequent switching from logic "0" to logic "1" involves the symmetric process of steps (e) thru (h) with the roles of $J_1$ and $J_2$ interchanged.

Since the total voltage drop along the bias current paths is the same in both logic states, the HUFFLE has good DC regulation; i.e., the power supply sees an essentially constant impedance regardless of the logic state of the HUFFLE.

A typical set of values for the circuit parameters for FIG. 1 might be $L_1 \approx L_2 \approx 10$ pH, $L_3 = 100$ pH $R_1 \approx R_2 = 1\Omega$, $I_b 1$ mA, $I_{J1} \approx I_{J2} \approx 1.5$ mA. This should provide typical switching times of $\approx 100$ psec.

Fanout Configurations

What has just been described is analogous to a flip-flop, an element which switches its state back and forth between two symmetric latched conditions in response to control means applied to two separate inputs. Accordingly, it has both memory and logic applications. In a typical logic application, $L_3$ forms an output or fanout line as shown by $L'_3$ ($\sim 100$ pH) in FIG. 2. In the logic "0" and logic "1" states, the current level in $L'_3$ is $\approx +I_b$ and $-I_b$ respectively, and either the magnetic field from this current or the current itself is available to act as control means for other downstream circuits, e.g., other HUFFLE circuits. The change in current level of $2I_b$ between the "0" and "1" states provides additional gain over usual designs which generally use O or $I_b$ as their current levels in the fanout line.

Of course, the current in other components, such as $L_1$ or $L_2$, can also be used to control downstream gates.

Figure 2:
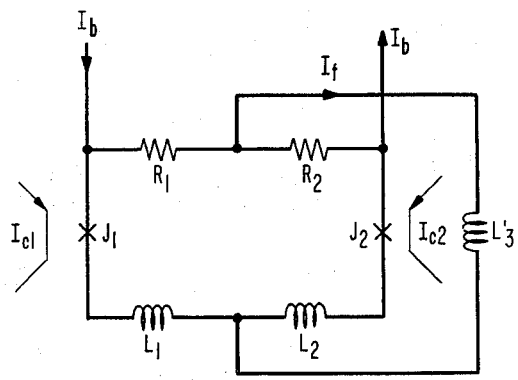
FIG. 2 is a circuit schematic in which the $L_3$-branch of FIG. 1 forms an output line designated $L'_3$.
Figure 3:
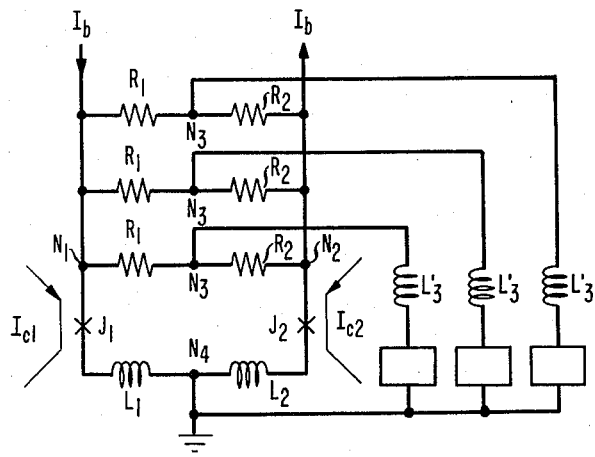
FIGS. 3 and 4 are circuit schematics in which the output current is split by means of resistive dividers in the passive network (FIG. 3) and in the fanout line (FIG. 4)
Figure 4:
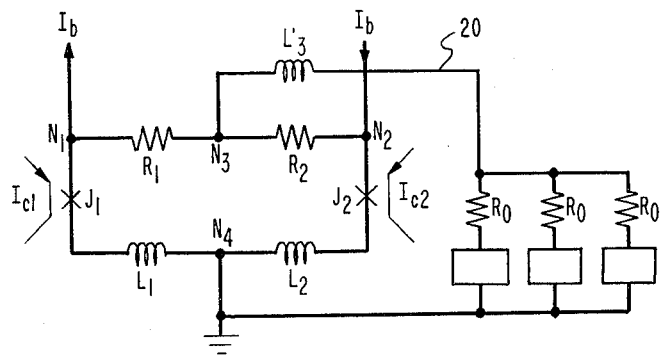

In the configuration of FIG. 2, the output line has no resistance and represents only a single current path for controlling other circuits. While a single output line is adequate for controlling a plurality of magnetic field switched circuits, for direct-coupled current controlled circuits, such as direct coupled goalposts or JAWS, for example, it is necessary to divide the current on the HUFFLE output line into two or more parts. One way of accomplishing this type of fanout is depicted in FIG. 3. A plurality of resistive dividers $R_1$-$R_2$ are connected between nodes $N_1$ and $N_2$ and the nodes $N_3$ are connected through separate output lines to node $N_4$, illustratively ground. Alternatively, as shown in FIG. 4, a resistive divider comprising a plurality of resistors $R_o$ in parallel may be inserted into the output line between nodes $N_3$ and $N_4$. In this case, however, node $N_3$ is not at zero voltage, and hence some bias current leaks through $R_2$ to ground when $J_2$ is at $V_2=0$ instead of being diverted to the output line. This problem is alleviated by increasing the bias current by a factor of approximately $(R_1+R_o/n)/R_1$, where n is the number of parallel resistors $R_o$. In FIGS. 3 and 4 the boxes in the fanout lines represent generalized influence means adapted to control other circuits (not shown) in a chain or array of circuits to perform a logic or memory function.

We recognize that the inductors $L_3$ and $L'_3$ have some of the characteristics of transmission lines depending on their length and characteristic impedance $Z_o$. In the case where $Z_o$ is of the order of, but larger than, $R_1$ or $R_2$, however, the basic HUFFLE operation remains the same in terms of one gate applying a reverse current-voltage transient to the other gate, even though the current in $L_3$ would no longer be fixed during the transient period of operation.

In addition, a matched transmission line can be placed in series with $L_3$ or $L'_3$ to form a fanout line. Thus, in FIG. 4, line 20 is in series with $L'_3$ and is terminated by n parallel resistors $R_o$ such that $R_o/n=Z_o$. Other configurations of this type are, of course, possible.

Logic Operations

Typical of flip-flop logic designs, some care should be taken regarding the timing on the "set" and "reset" control pulses (i.e., the control means applied to $J_1$ and $J_2$) in that a certain time ($\approx L_3/R_1$) should elapse after "setting" before the circuit will respond to a reset command. In addition to the logic "1" and "0" states, there is another stable condition for the circuit in which $V_1 \neq 0$ and $V_2=0$ and from which the circuit can only be freed by reducing the bias current to zero. This hung-up condition seems unlikely to occur provided that certain design precautions are taken against it; notably that the shorter of the times $L_3/R_1$ and $L_3/R_2$ is not short compared to the longest of the times $(L_1+L_2)/(R_1+R_2)$, $(R_1+R_2)C_1$, and $(R_1+R_2)C_2$ where $C_i$ ($i=1,2$) is the capacitance of $J_i$. Another circuit for avoiding the hung-up condition will be discussed hereinafter.

A typical logic operation might be to use the current in the output line $L_3$ in a HUFFLE gate A to provide magnetic field on both $J_1$ and $J_2$ in a downstream HUFFLE gate B but in opposite senses. This field could be added to a fixed offset field of the same sign on each of $J_1$ and $J_2$ of B, so that if A is in the logic "1" ("0") state, then B is also switched to the logic "1" ("0") state, or if the sign of the offset field on bias current on B is reversed, then A in the logic "1" ("0") state would cause B to switch to the logic "0" ("1") state accomplishing the INVERT function. Straightforward extensions to cover the usual 2-input functions OR, AND, NOR, and NAND and many other variations are self-evident to one of ordinary skill in the art. Since the current levels in the "0" and "1" state are symmetric, inversion of a signal follows from a simple reversal of sign of bias current or offset field.

Another mode of operation in logic is to mimic the usual latching procedure and start with all HUFFLEs in the logic "0" state. A sequence of logical operations would be carried out on gate $J_1$ only and the end result would be stored in a final HUFFLE. The other HUFFLEs would then be reset to the logic "0" state simultaneously by application of a common clock signal to their $J_2$ gates. Here, care would be necessary to insure that the inputs to $J_1$ and $J_2$ are not high simultaneously. In the configuration of FIG. 2 this has the advantage of an additional factor of two in gain over the latching designs. For this mode gates $J_1$ and $J_2$ need not be of the same design. An alternative approach, which is closer to traditional semiconductor logic, is to provide gates $J_1$ and $J_2$ with complementary signals; i.e., when the control for $J_1$ reaches its threshold value, the control for $J_2$ decreases below its threshold, and when $J_2$ is reset to $V_2=0$ and the bias current returns to it, its threshold is not exceeded. This complementary design gives somewhat reduced operating margins relative to the first-mentioned type of operation, with the amount of reduction depending upon how slowly the control signal changes relative to the current diversion times.

Punch-Through Considerations

As mentioned previously, an approximate way of looking at the transient redistribution of currents is to assume that on a short time scale the current in $L_3$ is fixed. Then, in the logic "0" state ($V_1=0$, $V_2\neq0$), when $J_1$ is switched to $V_1\neq0$ its voltage rises to $2\Delta_1$, larger in magnitude than and opposite in sign to the initial voltage across $J_2$. Regarding $J_2$ as a resistor-capacitor combination, it is evident that its voltage will either be forced to zero and latch there, or, if punch-through occurs, it will be forced to assume the same sign as that on $J_1$. The punch-through phenomenon is described by T. A. Fulton and R. C. Dynes in *Solid State Comm.*, Vol. 9, p. 1069 (1971).

If $J_2$ does latch at $V_2=0$, the current in $L_3$ then decays with $L_3/R$ ($R=R_1=R_2$) time constant, with the bias current ends up flowing into $N_1$ through $R_1$ out of $N_3$ through $L_3$, through $J_2$ into $N_2$. Alternatively, and more commonly, the voltage on $J_2$ punches through $V_2=0$ and reverses its value. The subsequent decay of the current in $L_3$ causes the voltage across $J_1$ to drop below $2\Delta_1$, and the voltage across $J_2$ decays back towards its original sign, giving a second chance for $J_2$ to lock to $V_2=0$. Since the rate of change of the current in $J_2$ is slower at this stage, punch-through is less likely, and can be prevented altogether by suitably increasing the $L_3/R$ time. In either case, then, $J_2$ ultimately returns to the $V_2=0$ state and the current flows as described above, corresponding to the logic "1" state. Note that if the $J_2$ gate did punch through the second time, both junctions would settle in the $V\neq0$ state with no current through $L_3$. Reduction of $I_b$ would be required to correct this "hung-up" condition.

Computer simulations have shown the time evolution of the currents as the HUFFLE makes the transition from the logic "0" state to the logic "1" state. The parameters used in the simulation were $L'=L_1+L_2=16$ pH, $L_3=100$ pH, $R=R_1=R_2=1.5\Omega$, $I_{J1}=I_{J2}=1$ mA, and $I_o=0.8$ mA. The junctions were assumed to be shunted by capacitors not shown with $C=4$ pF. Switching begins at 15 ps after time zero, and the voltage across $J_1$ reaches $2\Delta_1$ after about 30 psec. The voltage across $J_2$ punches through once, reversing its sign, and then latches at zero in the second pass, after approximately 50 psec. After $J_2$ latches to $V_2=0$, it undergoes plasma oscillations which transmit some current into the low-inductance loop of $L_1$ and $L_2$. The redistribution of the fanout current takes approximately $3L_3/R$, or some 200 psec to reach 90% of its full value. Some $L'C$ oscillations are evident in the early stages, which can be cured by decreasing $L'$.

As can be seen from the foregoing, two important aspects of the HUFFLE are: (1) that the fanout line possesses a large enough inductance $L_3$ to insure that the switching junction voltage overshoots its final value and causes reset of the other gate before the current diverts to the fanout line, and (2) that the punch-through event which leads to the hung-up state be avoided. How one deals with punch-through depends upon the propensity to punch-through of the particular gate configuration. The single junction approximating the Stewart-McCumber model is the worst in this respect. More complicated gates have internal degrees of freedom which tend to make punch-through less likely. For many gate designs we believe conditions (1) and (2) will hold if the inequality $2RC<L_3/R$ is satisfied. Also, the value of $L'$ should preferably be made small enough to damp the oscillations of the smaller loop, provided the value is compatible with the gate design.

Experimental Results

Several HUFFLE circuits have been fabricated by techniques of the type described by L. N. Dunkleberger in copending application Ser. No. 841,797 filed on Oct. 13, 1977 and assigned to the assignee hereof. These circuits, made in the configuration of FIG. 2, have shown the expected switching behavior. The individual gates were single, square, cross-type junctions of 8-micron linewidths. The circuit parameters were as follows: in one circuit $I_{J1}=660$ μA, $I_{J2}=720$ μA, $R_1=R_2=R=1.3\Omega$, $L_3=120$ pH, $L_1+L_2=L=30$ pH and $I_b=500$ μA; in another circuit $I_{J1}=1040$ μA, $I_{J2}=1170$ μA, $R_1=R_2=R=0.8\Omega$, $L_3=25$ pH, and $L_1+L_2=L'=6$ pH. Switching of the two gates was accomplished magnetically by currents running to ground through the bottom electrode of each junction. Proper switching occurred over a range of bias currents limited at the upper end by the smaller of the two critical currents $I_J$ and at the lower end by the larger of the two "drop-back" currents $I_o$. To accomplish switching the magnetic field on one junction was held at zero and that on the other was increased to depress $I_J$ to any desired value below the bias current. This process was repeated alternately on each junction. In typical tests some $10^8$ cycles were carried out without resulting in a hung-up condition. Similar results have been obtained using current switched junctions (e.g., JAWS) instead of magnetic field switched junctions.

In addition several chains of HUFFLEs were fabricated in which each controlled its downstream neighbor as a single-input OR or INVERT gate. Switching of the first member of the chain induced the subsequent members to switch accordingly. Several such chains were constructed using single junctions as gates with the magnetic field of the fanout current from the upstream gate flowing in the base electrode providing the control means. Chains of two, three and four HUFFLEs operated as expected. In this magnetic field-switched circuit longer chains lacked the critical current uniformity required in this rather low-gain configuration. However, in a current switched circuit employing JAWS gates, a chain of fourteen HUFFLEs has been built and operated successfully.

Alternative Circuit Structures

Figure 5:
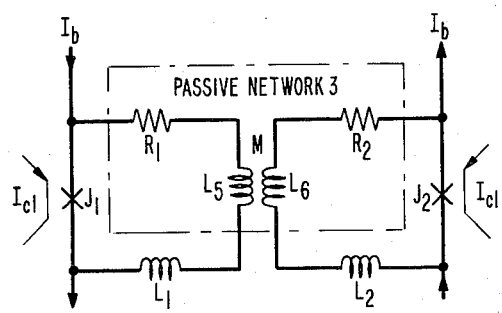
FIG. 5 is a circuit schematic of an embodiment of our invention in which the $L_3$-branch of FIG. 1 is formed by a pair of inductors coupled by a mutual inductance M.
Figure 6:
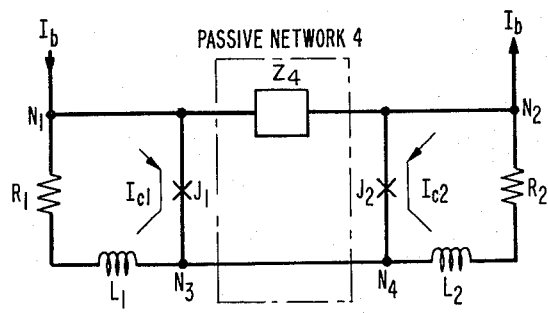
FIG. 6 is a circuit schematic of an embodiment of our invention in which the passive coupling network comprises a capacitor $C_4$ or a resistor $R_4$.
Figure 7:
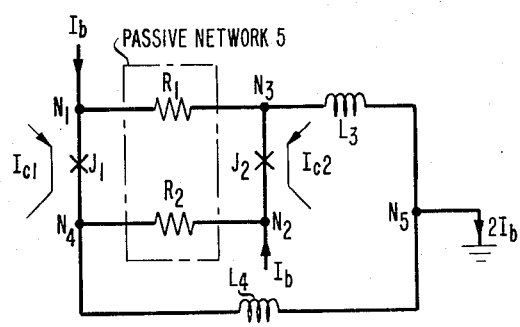
FIG. 7 is a circuit schematic of another embodiment of our invention.

Several alternative embodiments of HUFFLEs are shown in FIGS. 5-7.

In FIG. 5 the inductor $L_3$ of FIG. 1 has been replaced by a transformer formed by a pair of adjacent inductors $L_5$ and $L_6$ having mutual inductance M. One inductor is located in each loop circuit containing $J_1$ and $J_2$ with $M \approx L_5 \approx L_6$, the passive network, in this case includes $R_1$, $R_2$, and the transformer. This type of circuit might be particularly useful with gates, such as JAWS, which always have one end grounded. A plurality n of such HUFFLEs would otherwise require n separate current supplies in parallel and hence n times as much current, e.g., if each HUFFLE draws 0.1 mA then $10^6$ HUFFLEs would require 100 A at, say, 10 mV. Such a high current-low voltage supply tends to generate a lot of heat. Instead, we envision grouping the HUFFLEs on 100 separate chips, for example, so that on each chip most of the HUFFLEs are in parallel, but certain HUFFLEs have one gate coupled to the HUFFLEs on the same chip and their other gate coupled to another chip by a transformer arrangement as shown in FIG. 5. Thus, the current supply to the chips would be a series connection requiring less current (e.g., 1 A instead of 100 A).

A HUFFLE in which the passive network 4 comprises an impedance element $Z_4$ is shown in FIG. 6. In the case where $Z_4$ is a capacitor $C_4$, there are two resistive fanout or output lines ($R_1$-$L_1$ and $R_2$-$L_2$ in parallel with $J_1$ and $J_2$ respectively). The logic "0" state corresponds, for example, to essentially zero current through $R_1$ ($J_1$ at $V_1=0$) and current flowing through $R_2$ ($J_2$ at $V_2\neq 0$), and conversely for the logic "1" state. Because capacitors tend to be large area devices, this type of circuit is not preferred since it takes up a disproportionate share of chip "real estate" and thereby results in a lower packing density. However, the capacitor $C_4$ can be replaced by a resistor $R_4$ provided that the bias current is increased by a factor of roughly $(1+R_1/R_4)$ to return the currents to the same level as when $R_4$ is replaced by $C_4$.

Another design of our invention is shown in FIG. 7, a four node bridge circuit in which gates $J_1$ and $J_2$ are in one pair of opposite arms and resistors $R_1$ and $R_2$ are in the other pair. The resistors function as a part of passive network 5, as before. Bias current $I_b$ is applied to opposite nodes $N_1$ (between $J_1$ and $R_1$) and $N_2$ (between $J_2$ and $R_2$). A pair of fanout lines including self-inductances $L_3$ and $L_4$ are connected between a node $N_5$ (e.g., ground) and the other pair of opposite nodes $N_3$ and $N_4$ respectively. The currents in the fanout lines through $L_3$ and $L_4$ are $2I_b$ and zero, respectively, when $J_1$ is at $V_1\neq 0$. Conversely, the currents are zero and $2I_b$ in $L_3$ and $L_4$ when $J_2$ is at $V_2\neq 0$. Here $L_3$ and $L_4$ serve the same role as $L_3$ of FIGS. 1 and 2, i.e., they function as fanout lines and to hold the current roughly fixed while switching is taking place. In addition, $L_3$ and $L_4$ form a part of passive network 5, although for clarity of illustration they have not been positioned within the dashed-line box in the figure.

This circuit has the advantage that only one bias current bus is required and that the current swing in the fanout line is $2I_b$ (neglecting leakage).

The Hung-Up Condition

In the discussion of FIG. 1 a hung-up condition in which $V_1\neq 0$ and $V_2\neq 0$ was defined. We pointed out that it is unlikely to occur if the time constants of the circuit are appropriately chosen.

Alternatively, if the resistor $R_1$ is made as shown in FIG. 1 (so that the voltage across $J_1$ is less than $2\Delta_1$), while $R_2$ is made smaller such that $IR_2<V_{o2}$ (where $V_{o2}$ = the dropback voltage of $J_2$), then the behavior of the circuit is as described before in paragraphs (a) through (f). But, at stage (g) the junction $J_2$ resets to the $V_2=0$ state, and the circuit relaxes with rather longer time constant $L_3/R_2$ to a state in which $V_1=V_2=0$ and current flows in the outside loop from $N_1$ to $N_4$ to $N_2$. This condition is then the logic "0" state. The logic "1" state is the same as for FIG. 1. Although this circuit has no hung-up condition, it is slower and the current swing in the fanout line is $I_b$, rather than $2I_b$. In this embodiment, switching $J_2$ to $V_2\neq 0$ generates a transient which switches $J_1$ to $V_1=0$ but the converse does not happen, i.e., $J_2$ resets to $V_2=0$ as described above.

Conclusions

Some advantageous characteristics of the basic HUFFLE of FIGS. 1-4, in addition to its DC powered nature, are the following: (1) It is capable of reasonably high speeds, owing to the moderately large resistors which also facilitate impedance matching of transmission lines, particularly in the configuration of FIG. 6. (2) In the configuration of FIG. 2 the circuit has a current swing in the fanout line of twice the bias current, allowing increased switching margins and/or faster circuit operation, enabling for example the use of two-junction interferometers as gates with realistic switching margins. Alternatively, as in FIGS. 3, 4 and 6, one may obtain increased parallel fanout. (3) Since the voltage drop across the HUFFLE is constant to a first order approximation, series bias through high-inductance connections is possible without severe problems of DC regulation. (4) The HUFFLE is compatible with most present gate designs, both current-switched and magnetic-field switched. (5) The range of circuit parameters providing proper operation of the resetting is relatively wide, the requirements being mainly that the value of $RI_J$ lie in roughly the range $\Delta/3$ to $3\Delta/2$, and that $RC<L_3/R$, where $R=R_1$, $R_2$. The margins of operation imposed by the individual gate designs will generally be more restrictive.

Some disadvantageous features are the following: (1) The finite power dissipation together with the finite resistance presented to the bias current may render the HUFFLE attractive mostly in smaller scale memory applications. (2) In symmetric designs the speed of operation is limited by the speed involved in the transition $V \neq 0$ to $V=0$, rather than the somewhat faster opposite transition. (3) In parallel bias the area and power consumption by the bias lines is about twice that of a single-gate design. (4) Similarly, the area occupied by a HUFFLE is about twice that of a single gate, omitting the fanout lines.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, a monostable pulse generator results from a basic HUFFLE of the type shown in FIG. 2 if $I_{J1} > I_b > I_{J2}$. In this case the output pulse width is determined by the circuit parameters rather than by the width of a control pulse applied to either gate. Secondly, the HUFFLE can function as an oscillator if $I_b > I_{J1}$ and $I_{J2}$.

It should be noted that we have used symmetric bias current supplies to each gate of the HUFFLE for purposes of illustration only. The bias current could be supplied asymmetrically as well so that one gate received $I_{b1}$ and the other $I_{b2}$. Thus, in FIG. 1, for example, node $N_4$ could be used to supply bias current in addition to nodes $N_1$ and $N_2$.

We claim:
1. A superconductive circuit comprising
   first and second Josephson junction latching gates ($J_1$, $J_2$) each having $V=0$ and $V \neq 0$ states, a critical current which when exceeded causes the gate to switch from its $V=0$ to its $V \neq 0$ state, and a dropback level below which the gate switches from its $V \neq 0$ to its $V=0$ state,
   electrode means ($N_1$, $N_2$) for applying DC bias current ($I_b$) to said gates,
   control means ($I_{c1}$, $I_{c2}$) for selectively switching said gates from their $V=0$ to their $V \neq 0$ states,
   one of said gates being initially set to its $V=0$ state and the other to its $V \neq 0$ state, CHARACTERIZED IN THAT said circuit is rendered unlatching by
   a passive network (1, 3, 4, 5) coupling said gates to one another and responsive to the switching of states of said one gate from its $V=0$ to its $V \neq 0$ state for applying a transient current to said other gate in a direction opposite to the direction said bias current flows therein and effective to reduce current in said other gate below the drop-back level thereof, thereby automatically resetting said other gate from its $V \neq 0$ to its $V=0$ state.

2. The circuit of claim 1 wherein the bias current flowing in each of said gates, when in its $V=0$ state, is less than the critical current of said gate.

3. The circuit of claim 1 wherein said passive network is responsive to the switching of either of said gates for generating a transient current which is effective to reverse the sign of the current on the other of said gates, and wherein the duration of said transient current is long enough to discharge the capacitance of said other gate to at least zero voltage.

4. The circuit of claim 1, 2 or 3 wherein
   said electrode means includes a first node ($N_1$) for applying bias current to said gates and a second node ($N_2$) for extracting bias current from said gates,
   said passive network comprises
   a first resistor ($R_1$) connected between said first node ($N_1$) and a common third node ($N_3$),
   a second resistor ($R_2$) connected between said second node ($N_2$) and said common node ($N_3$), and
   inductance means ($L_3$) connected between a fourth node ($N_4$) and said common node ($N_3$), and wherein
   said first gate ($J_1$) is connected between said first and fourth nodes and said second gate ($J_2$) is connected between said second and fourth nodes.

5. The circuit of claim 4 wherein the following relationships are satisified: the smaller of $L_3/R_1$ and $L_3/R_2$ is greater than the largest of $(L_1+L_2)/(R_1+R_2)$, $(R_1+R_2)C_1$ and $(R_1+R_2)C_2$, and $$\frac{2\Delta_1}{(R_{J2} + R_1 + R_2)} > \frac{I_b R_2}{(R_{J2} + R_2)}$$

$$\frac{2\Delta_2}{(R_{J1} + R_1 + R_2)} > \frac{I_b R_1}{R_{J1} + R_1}$$

where $R_J$ is the resistance of a gate; C is the capacitance of a gate; and $2\Delta$ is the superconductor energy gap voltage; so that the switching of said first gate reverses the sign of the current through said second gate, and conversely.

6. The circuit of claim 5 wherein said inductance means ($L_3$) is included in a circuit branch which forms an output line of said circuit.

7. The circuit of claim 6 wherein said resistors $R_1$ and $R_2$ and said common node $N_3$ therebetween form a resistive divider between said nodes $N_1$ and $N_2$, and including a plurality of said dividers connected in parallel between said nodes $N_1$ and $N_2$, and wherein said inductance means ($L_3$) comprises a plurality of fanout lines each including inductance means ($L'_3$) connected between said fourth node ($N_4$) and separate ones of the common nodes ($N_3$).

8. The circuit of claim 6 wherein said fanout line includes a plurality of parallel resistors, each forming a separate fanout line, connected in series between said nodes $N_3$ and $N_4$.

9. The circuit of claims 1, 2, or 3 including first and second coupled loop circuits,
   said first loop circuit having a first node ($N_1$) for receiving bias current,
   said second loop circuit having a second node ($N_2$) for extracting bias current,
   said first loop circuit comprising a first circuit branch in which said first gate is located, a first resistor ($R_1$), said inductance means ($I_3$) and first inductance means ($L_1$) connected in series with one another,
   said second loop circuit comprising a second circuit branch in which said second gate is located, a second resistor ($R_2$), said inductance means ($L_3$), and second inductance means ($L_2$) connected in series with one another, where said first and second inductance means ($L_1$ and $L_2$) correspond to the self-inductance of said first and second circuit branches, respectively, and said passive network comprises said first and second resistors ($R_1$ and $R_2$) and said inductance means ($L_3$).

10. The circuit of claim 9 wherein the smaller of $L_3/R_1$ and $L_3/R_2$ is greater than the largest of $(R_1+R_2)C_1$, $(R_1+R_2)C_2$ and $(L_1+L_2)/(R_1+R_2)$.

11. The circuit of claim 9 wherein said inductance means ($L_3$) comprises separate inductors forming a transformer having a mutual inductance (M) and self-inductances ($L_5$ and $L_6$).

12. The circuit of claim 11 wherein M, $L_5$ and $L_6$ are approximately equal.

13. The circuit of claim 1 comprising
a first loop circuit including a first circuit branch in which said first gate is located, a first resistor ($R_1$), and first inductance means ($L_1$) connected in series with one another,
a second loop circuit including a second circuit branch in which said second gate is located, a second resistor ($R_2$), and second inductance means ($L_2$) connected in series with one another, where said first and second inductance means ($L_1$ and $L_2$) correspond respectively to the self-inductance of said first and second circuit branches,
said bias current is applied to a first node ($N_1$) of said first loop and is extracted from a second node ($N_2$) of said second loop, and
said passive network comprises an impedance element $Z_4$ coupling said first and second nodes.

14. The circuit of claim 13 wherein said impedance element comprises a capacitor.

15. The circuit of claim 13 wherein said impedance element comprises a resistor.

16. A superconductive circuit including
first, second, and third inductance means ($L_1$, $L_2$, $L_3$, respectively),
a first loop circuit comprising a first circuit branch, a first Josephson junction gate ($J_1$) located in said first branch, a first resistor ($R_1$), said third inductance means ($L_3$), and said first inductance means ($L_1$) connected in series with one another,
a second loop circuit comprising a second circuit branch, a second Josephson junction gate ($J_2$) located in said second branch, a second resistor ($R_2$), said third inductance means ($L_3$), and said second inductance means ($L_2$) connected in series with one another, where said first and second inductance means ($L_1$ and $L_2$) correspond respectively to the self-inductance of said first and second circuit branches, respectively, and said third inductance means ($L_3$) forms a common circuit branch between said loop circuits,
said first loop circuit including a first node ($N_1$) adapted to receive DC bias current ($I_b$),
said second loop circuit including a second node ($N_2$) adapted to extract said DC bias current, and
control means ($I_{c1}$, $I_{c2}$) for selectively switching said gates from their $V=0$ to their $V\neq 0$ states, said circuit satisfying the following inequalities: the smaller of $L_3/R_1$ and $L_3/R_2$ is greater than the largest of $(R_1+R_2)C_1$, $(R_1+R_2)C_2$ and $(L_1+L_2)/(R_1+R_2)$, and $$\frac{2\Delta_1}{(R_{J2}+R_1+R_2)} > \frac{I_b R_2}{(R_{J2}+R_2)}$$

$$\frac{2\Delta_2}{(R_{J1}+R_1+R_2)} > \frac{I_b R_1}{(R_{J1}+R_1)}$$

where $R_J$ is the resistance of a gate; C is the capacitance of a gate; and $2\Delta$ is the superconductor energy gap voltage; so that the switching of said first gate reverses the sign of the current through said second gate, and conversely.

17. A superconductive circuit comprising
a first loop circuit including a first Josephson junction gate ($J_1$), a self-inductance ($L_1$) associated with said first gate, and a first resistor ($R_1$) connected in series with one another, a first node ($N_1$) for applying DC bias current ($I_b$) to said first loop circuit, and a third node ($N_3$) for extracting current from said first loop circuit,
a second loop circuit comprising a second Josephson junction gate ($J_2$), a self-inductance ($L_2$) associated with said second gate, and a second resistor ($R_2$) connected in series with one another, a second node ($N_2$) for extracting said bias current from said second loop circuit, and a fourth node ($N_4$) for applying bias current to said second loop circuit,
each of said gates having a current drop-back level below which the gate switches from its $V\neq 0$ state, to its $V=0$ state,
an impedance element ($Z_4$) coupling said first and second nodes ($N_1$, $N_2$) so that the switching of said first gate ($J_1$) applies a current transient to said second gate ($J_2$) effective to reduce the current thereof below its drop-back level, and conversely, and
means connecting said third and fourth nodes to one another.

* * * * *

UNITED STATES PATENT AND TRADEMARK OFFICE
CERTIFICATE OF CORRECTION

PATENT NO. : 4,373,138

DATED : February 8, 1983

INVENTOR(S) : Theodore A. Fulton and Arthur F. Hebard

It is certified that error appears in the above—identified patent and that said Letters Patent is hereby corrected as shown below:

In column 3, line 51, "34,589" should read --34,569--.
Column 5, line 34, "comparted" should read --compared--;
line 35, "voltages" should read --voltage--; line 60,
"$I_b 1$" should read --$I_b = 1$--. Column 6, line 34,
"where n" should read --where $\underline{n}$--; line 52, "n parallel"
should read --$\underline{n}$ parallel--; line 63, "$V_2=0$" should read
--$V_2 \neq 0$--. Column 9, line 34, "plurality n" should read
--plurality $\underline{n}$--; line 35, "require n" should read
--require $\underline{n}$--; line 36, "hence n" should read --hence $\underline{n}$--.
Column 10, line 28, "dropback" should read --drop-back--.
Column 12, line 27, that portion of the equation reading $$\frac{I_b R_1}{R_{J1} + R_1} \quad \text{should read} \quad \frac{I_b R_1}{(R_{J1} + R_1)}$$

Column 12, line 58, "($I_3$)" should read --($L_3$)--.

Signed and Sealed this

Twenty-sixth Day of April 1983

[SEAL]

Attest:

Attesting Officer

GERALD J. MOSSINGHOFF

Commissioner of Patents and Trademarks